(12) United States Patent
Baur et al.

(10) Patent No.: US 7,015,514 B2
(45) Date of Patent: Mar. 21, 2006

(54) LIGHT-EMITTING DIODE AND METHOD FOR THE PRODUCTION THEREOF

(75) Inventors: Johannes Baur, Deuerling (DE); Dominik Eisert, Regensburg (DE); Michael Fehrer, Bad Abbach (DE); Berthold Hahn, Hermau (DE); Volker Härle, Waldetzenberg (DE); Ulrich Jacob, Regensburg (DE); Werner Plass, Regensburg (DE); Uwe Strauss, Bad Abbach (DE); Johannes Völkl, Erlangen (DE); Ulrich Zehnder, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/451,836

(22) PCT Filed: Jan. 15, 2002

(86) PCT No.: PCT/DE02/00092

§ 371 (c)(1),
(2), (4) Date: Jun. 25, 2003

(87) PCT Pub. No.: WO02/056390

PCT Pub. Date: Jul. 18, 2002

(65) Prior Publication Data

US 2004/0051106 A1    Mar. 18, 2004

(30) Foreign Application Priority Data

Jan. 15, 2001  (DE) ............................... 101 01 554

(51) Int. Cl.
*H01L 33/00* (2006.01)

(52) U.S. Cl. .......................... 257/100; 257/98; 257/99; 257/676; 438/22; 438/25; 438/29

(58) Field of Classification Search .......... 257/98–100, 257/676; 438/22, 25, 29, 36–37
See application file for complete search history.

(56) References Cited

U.S. PATENT DOCUMENTS

| | | | |
|---|---|---|---|
| 2,983,823 A | 5/1961 | Oberly | |
| 3,593,055 A | 7/1971 | Geusic et al. | |
| 5,432,808 A | 7/1995 | Hatano et al. | |
| 5,528,474 A | 6/1996 | Rigsby et al. | |
| 5,907,151 A * | 5/1999 | Gramann et al. | 250/214.1 |
| 5,925,898 A * | 7/1999 | Spath | 257/98 |
| 6,271,049 B1 * | 8/2001 | Auracher et al. | 438/29 |
| 6,294,800 B1 * | 9/2001 | Duggal et al. | 257/89 |
| 2002/0030194 A1 * | 3/2002 | Camras et al. | 257/98 |

FOREIGN PATENT DOCUMENTS

| | | |
|---|---|---|
| DE | 15 89 274 A | 3/1970 |
| DE | 26 34 330 A | 2/1977 |
| DE | 41 41 980 A1 | 12/1991 |
| DE | 195 27 026 A1 | 7/1995 |
| DE | 297 24 284 U1 | 9/2000 |

(Continued)

*Primary Examiner*—Donghee Kang
(74) *Attorney, Agent, or Firm*—Cohen, Pontani, Lieberman & Pavane

(57) ABSTRACT

A light-emitting diode (1) has a lens body (3) that is fabricated from an inorganic solid. Fastened on the lens body (3) are semiconductor chips (2) that emit light beams (18). Furthermore, the light-emitting diode (1) is provided with a housing (20) that can be screwed into a conventional lamp holder via a thread (21).

23 Claims, 5 Drawing Sheets

FOREIGN PATENT DOCUMENTS

| | | |
|---|---|---|
| EP | 0 809 304 | 11/1997 |
| EP | 0 933 823 A | 8/1999 |
| FR | 1 416 993 | 11/1965 |
| JP | 61 082486 A | 9/1986 |
| JP | 02 134260 | 8/1990 |
| JP | 04 137674 A | 5/1992 |
| JP | 07 169994 A | 11/1995 |
| WO | WO 97 28565 A | 8/1997 |
| WO | WO 00 65665 A | 11/2000 |
| WO | WO 02 07229 A | 1/2002 |

* cited by examiner

LIGHT-EMITTING DIODE AND METHOD FOR THE PRODUCTION THEREOF

This is a U.S. national stage of application No. PCT/DE02/00092, filed on 15 Jan. 2002.

FIELD OF THE INVENTION

The invention relates to a light-emitting diode comprising a semiconductor chip that has a photon-emitting active layer applied on a substrate, and a subsequent contact layer that is transparent at least to some of the photons. It also relates to a method for fabricating the light-emitting diode.

BACKGROUND OF THE INVENTION

Such a light-emitting diode is disclosed in U.S. Pat. No. 5,432,808 A. The light-emitting diode has a semiconductor chip that has an electrically conducting, doped substrate made from SiC. Applied to the substrate is a layer of composition $Ga_xAl_yIn_{1-x-y}N$, wherein the values of x and y are in the range of $0 \leq x \leq 1$ and $0 \leq y \leq 1$. The semiconductor chip is applied to a carrier body and connected to external connecting lines via bond wires. Moreover, the semiconductor chip is embedded in a protective covering made from synthetic resin, which simultaneously serves as lens. A disadvantage of the known light-emitting diodes is the fact that the protective covering lacks resistance to radiation of high photon energy, since the semiconductor chip Starting from this prior art, it is the object of the invention to create a light-emitting diode that emits light in the UV region and is suitable for power applications. A further aim is to specify a method for fabricating said light-emitting diodes.s based on GaAlInN emit light in the UV region as far as the shortwave green wavelength region. Also, the problem of heat removal is not sufficiently solved for power applications in the case of the known light-emitting diodes, since synthetic resin generally constitutes a poor thermal conductor.

SUMMARY OF THE INVENTION

One object of the invention is to provide a light-emitting diode that emits light in the UV region and is suitable for power applications. A further object is to specify a method for fabricating said light-emitting diodes.

This and other objects are attained in accordance with one aspect of the invention which is directed to a light-emitting diode comprising a semiconductor chip that has a photon-emitting active layer applied on a substrate, and, seen from the substrate, a contact layer subsequent to the active layer. Arranged on the contact layer is a lens body that is made from a radiation-resistant solid, is transparent to the emitted photons, and dissipates the heat from the active layer.

Another aspect of the invention is directed to a method for producing a light-emitting diode, in which the semiconductor chip is connected to the lens body by means of laser soldering through the lens body, in particular via a conductor track located on the lens body. The method preferably includes fabricating a plurality of lens bodies in a wafer composite, applying conductor tracks for a plurality of semiconductor chips to the side of the wafer composite on which the semiconductor chips are later mounted, fastening a plurality of semiconductor chips on the conductor tracks by means of laser soldering through the wafer composite, and dividing the wafer composite into smaller lens body units or into individual lens bodies with semiconductor chips.

In this case of a light-emitting diode in accordance with an aspect of the invention, the transparent lens body is preferably fabricated from a light-resistant inorganic solid. Such solids are, for example, SiC, $Al_2O_3$ as well as glass and garnet crystals. Their material properties are also not changed by irradiation with UV light. Moreover, by comparison with synthetic resin these materials have good thermal conductivity and are therefore suitable for cooling the semiconductor chip even in power operation accompanied by high electric and high light powers.

In the case of the inventive method, the semiconductor chip is connected to the lens body by means of laser soldering through the lens body, in particular via a conductor track located on the lens body.

The following method steps are preferably carried out:
(a) fabricating a plurality of lens bodies in a wafer composite;
(b) applying electric conductor tracks for a plurality of semiconductor chips to the side of the wafer composite on which the semiconductor chips are later mounted;
(c) fastening a plurality of semiconductor chips on the conductor tracks by means of laser soldering through the wafer composite; and
(d) dividing the wafer composite into smaller lens body units or into individual lens bodies with semiconductor chips.

It is also preferred that between the steps (c) and (d) electric conductor tracks for the electric connection of rear contacts of the semiconductor chips are applied to the wafer composite.

BRIEF DESCRIPTION OF THE DRAWINGS

Further advantages and advantageous developments of the invention can be seen from the exemplary embodiments explained hereinafter in connection with FIGS. 1 to 7b, in which.

DETAILED DESCRIPTION OF THE DRAWINGS

Figure 1:
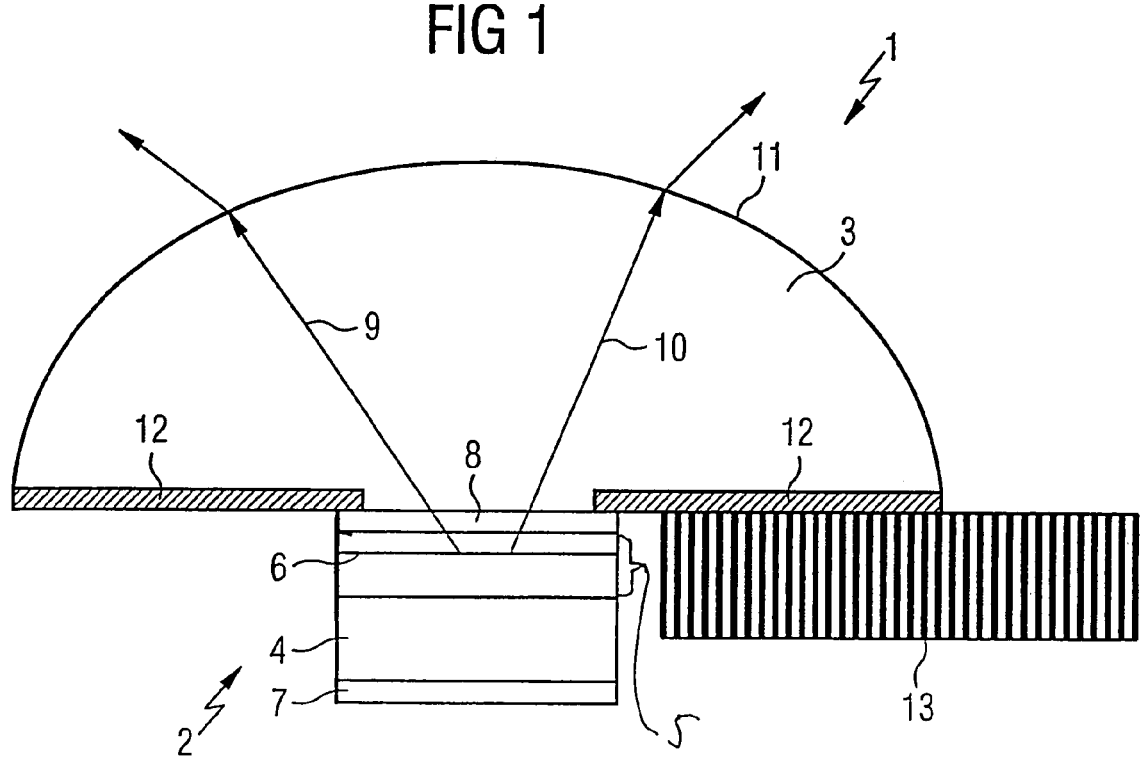
FIG. 1 shows a schematic of a cross section through a light-emitting diode.

Components of the exemplary embodiments that are identical or act identically are provided with the same reference numerals in each case in the figures.

The light-emitting diode of FIG. 1 has a semiconductor chip 2 and a lens body 3 mounted thereon. The semiconductor chip 2 has a substrate 4 on which there is applied an active layer 5 with a pn junction 6. In a preferred embodiment the active layer 5 is a single-quantum well or multi-quantum well structure. The active layer 5 is fabricated, for example, on the basis of $Ga_xAl_yIn_{1-x-y}N$, where the values of x and v are in the ranges of $0 \leq x \leq 1$, $0 \leq y \leq 1$ and $x+y \leq 1$. Applied on the rear side of the substrate 4 is an n-side contact layer 7 that is preferably of reflecting contact layer. Finally, there is arranged on the front side of the semiconductor chip 2 a p-side contact layer 8 that is transparent to photons emitted by the active layer 5 and against which the lens body 3 bears or makes physical contact therewith. The p-side contact layer 8 comprises, for example, an approximately 6 nm-thick platinum layer, an island-like or network-like metallic structure, indium-tin-oxide (ITO) or ZnO.

The lens body 3, here a plano-convex lens, at whose planar side the semiconductor chip 2 is arranged in such a way that the photons it emits are coupled into the lens body 3, is fabricated from a light-resistant inorganic solid that is capable of removing heat loss from the active layer 5.

In this context, it is to be understood by the term light resistant that the solid exhibits no change in the absorption coefficient by more than 10% over the service life of the light-emitting diode 1. Such materials are, for example, SiC, $Al_2O_3$ as well as glass and garnet crystals.

The photons emitted by the active layer 5, and whose path through the chip and the lens body in FIG. 1 is illustrated by light beams 9 and 10 (refraction effects being neglected in this illustration) can penetrate the p-side contact layer 8 and the lens body 3 and leave the latter at a luminous surface 11. Since the optical properties of the lens body 3 change only little over the service life of the light-emitting diode 1, a good outcoupling efficiency is ensured beyond the service life of the light-emitting diode 1.

Conductor tracks 12 are constructed on the planar side of the lens body 3 facing the semiconductor chip 2. It is also possible to arrange on the underside of the lens body 3 a heat sink 13 that serves to dissipate the heat that is transferred from the chip 2 to the lens body 3.

Figure 2:
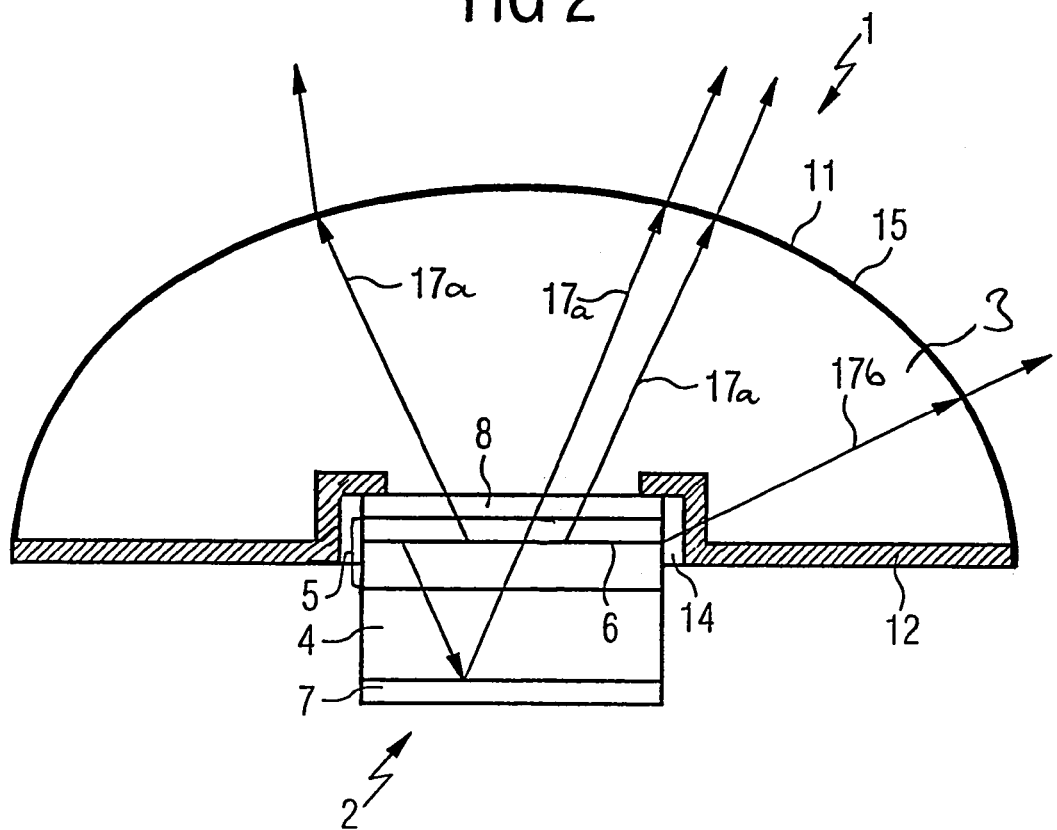
FIG. 2 shows a schematic of a cross section through a modified exemplary embodiment of the light-emitting diode of FIG. 1.

In the modified exemplary embodiment of the light-emitting diode 1 illustrated in FIG. 2, the lens body 3 has at the "planar" side a depression 14 into which the semiconductor chip 2 is introduced in such a way that most part of the the active layer 6 is situated inside the depression 14. In particular, the depression 14 is constructed such that the pn junction 6 is situated inside the depression such that light 17b emerging laterally from the semiconductor chip 2 can be picked up by the lens body 3.

It is also possible to provide on the luminous surface 11 of the lens body 3 an antireflection coating 15 that reduces the jump in the refractive index at the luminous surface 11, and thereby facilitates the outcoupling of the light from the lens body 3. The antireflection coating 15 is expediently fabricated from a dielectric. The antireflection coating 15 can also contain one or more optically active conversion materials that convert light of a specific wavelength into light that has a longer wavelength. These conversion materials can also be embedded in the lens body 3 itself.

Figure 3:
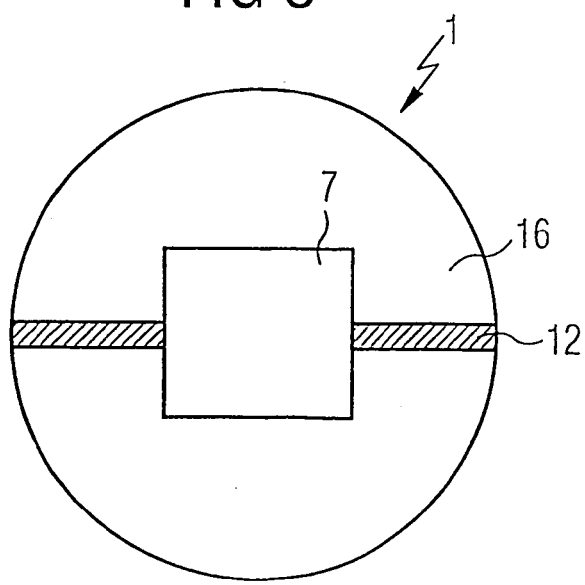
FIG. 3 shows a schematic of a bottom view of the light-emitting diode of FIG. 2.

Furthermore, as shown in FIG. 3, provided on the underside in the case of the light-emitting diode 1 in accordance with the exemplary embodiment of FIG. 2 is a reflecting layer 16 that extends over the underside of the lens body 3 not covered by the conductor track 12. This reflecting layer 16 can alternatively also be applied over the entire surface of the "planar" side of the lens body situated outside the depression 14. In this case, the reflecting layer is located between the conductor tracks 12 and the lens body 3, absorption at the conductor tracks 12 thereby being reduced as far as possible.

Light beams that are not, like the light beams 17a, b illustrated in FIG. 2, coupled out of the luminous surface 11 upon first impinging on the convex side of the lens body 3 but are reflected back at said luminous surface, are reflected by the reflecting layer 16 into the lens body 3 such that they are capable in some circumstances of being coupled out of the lens body 3 when impinging for the second time on the luminous surface 11.

Figure 4:
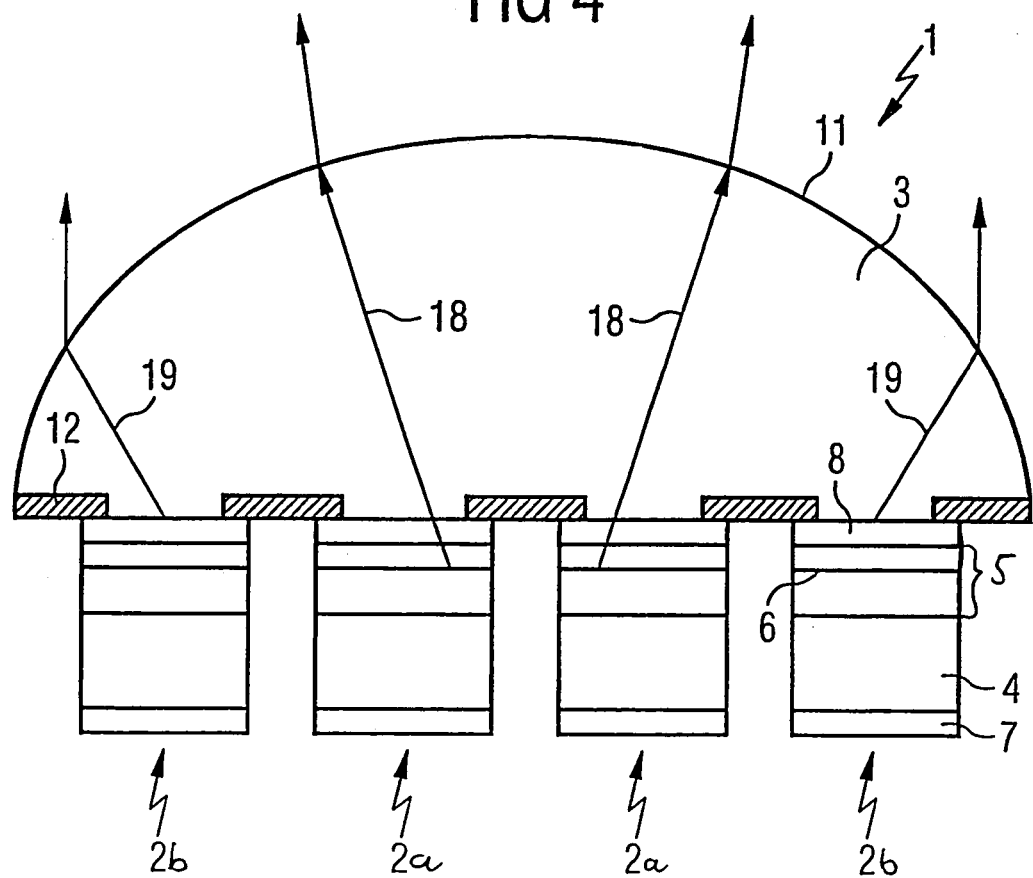
FIG. 4 shows a schematic of a cross section through a further modified exemplary embodiment of the light-emitting diode.

FIG. 4 shows a modified exemplary embodiment in which a plurality of semiconductor chips 2 are fastened on the underside of the lens body 3. Light beams that emerge from the inner semiconductor chips 2a, like the light beams 18 depicted in FIG. 4, thereby have a higher outcoupling probability than the light beams 19 emerging from the outer semiconductor chips 2b, since said light beams 19 impinge on the luminous surface 11 at more unfavorable angles. This disadvantage can, however, be at least partially reduced, for example by a reflecting layer 16 on the "planar" side of the lens surface 3 at which these light beams are reflected once again to the convex lens surface.

Figure 5:
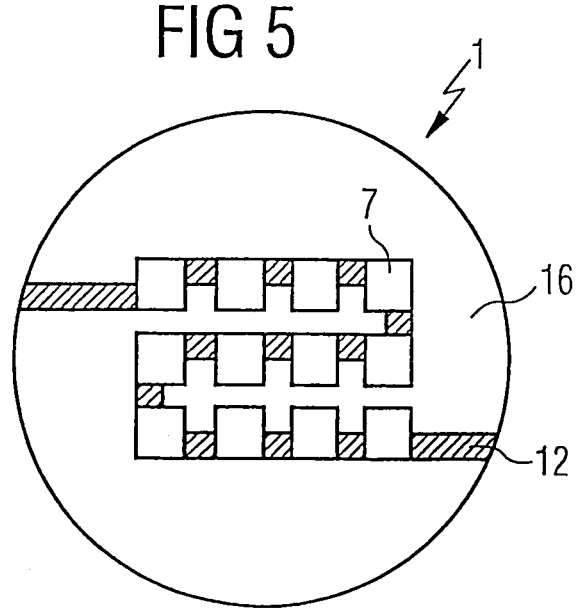
FIG. 5 shows a schematic of a bottom view of the light-emitting diode of FIG. 4.

Illustrated in FIG. 5 is a bottom view onto the light-emitting diode 1 in accordance with FIG. 4, it being possible to see from the figures that the semiconductor chips 2 make serial contact via the conductor track 12. It is also conceivable for the conductor track 12 to be constructed like a grid of rows and columns among the multiple semiconductor chips, in order to ensure a uniform operating voltage at the semiconductor chips by parallel connection.

Figure 6:
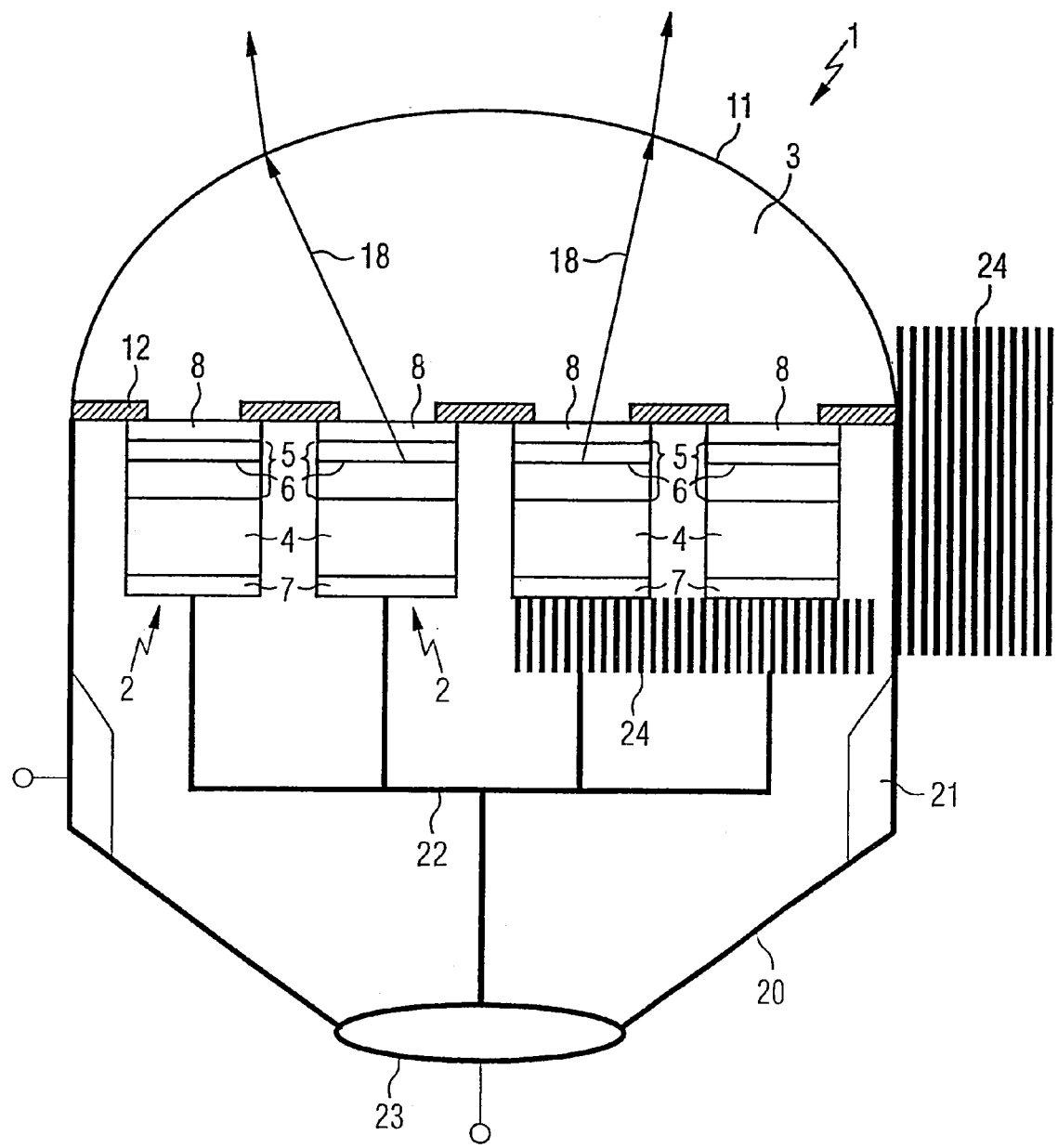
FIG. 6 shows a schematic of a cross section through a light-emitting diode that is equipped with a housing provided with a thread.

As illustrated by way of example in FIG. 6 for the exemplary embodiment in accordance with FIG. 4, the light-emitting diodes 1 illustrated in FIGS. 1 to 5 can also be provided with a housing 20 that can, for example, be screwed into a conventional lamp holder via a thread 21.

However, it is also possible to select for the housing 20 any other desired suitable connecting technology such as, for example, the surface-mounting technology widespread in semiconductor technology.

In the case of the exemplary embodiment illustrated in FIG. 6, the housing 20 is connected via the conductor track 12 to the p-side contact layers 8 of the semiconductor chips 2. The n-side contact layers are connected via a separate line 22 to a connecting contact 23 insulated with respect to the housing 20.

In the case of the exemplary embodiment illustrated in FIG. 6, the light-emitting diode 1 can dissipate the heat both via the lens body 3 to the surrounding medium, generally air, and via the housing 20, it being possible to provide at the housing 20 additional heat sinks 24, which are connected to the connecting contacts 12 and 7 and constitute additional heat sinks.

The light-emitting diode illustrated in FIG. 6 is suitable, in particular, as a replacement for conventional incandescent lamps, the volume of the light-emitting diode 1 being substantially smaller than the volume of conventional incandescent lamps, given the same light power.

Figure 7A:
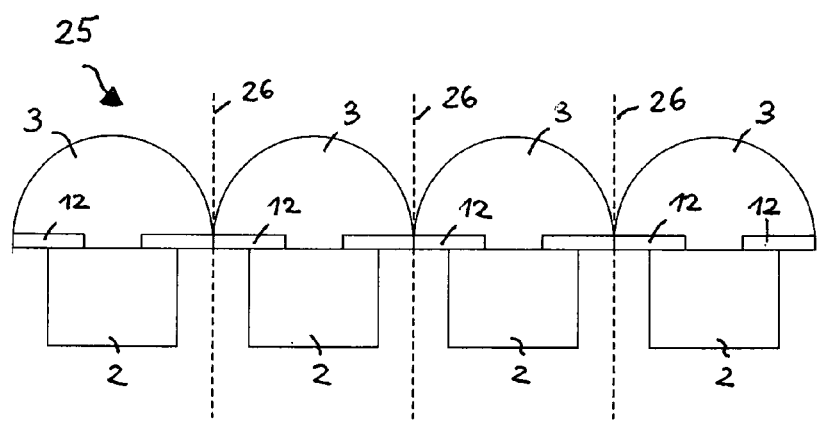
FIG. 7a shows a plurality of lens bodies for light-emitting diodes fabricated on a wafer composite.

FIG. 7a shows a plurality of lens bodies 3 for light-emitting diodes that are fabricated on a wafer composite 25. Conductor tracks 12 for a plurality of semiconductor chips 2 are applied to the side of the wafer composite 25 on which the semiconductor chips 2 are later mounted. A plurality of semiconductor chips 2 are fastened on the conductor tracks 12 by means of laser soldering through the wafer composite 25.

Figure 7B:
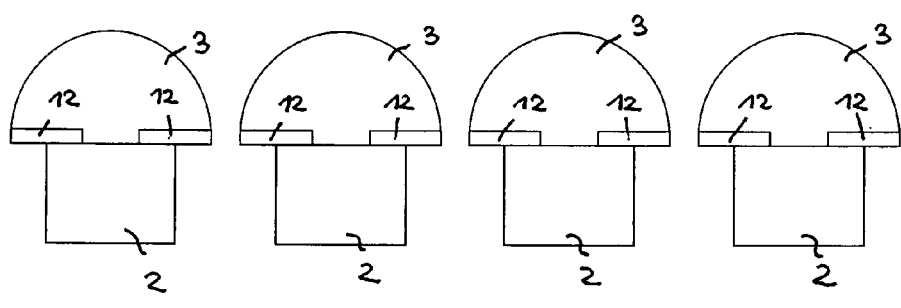
FIG. 7b shows single lens bodies that are made by dividing the wafer composite of FIG. 7a into a plurality of individual light-emitting diodes.

FIG. 7b shows single lens bodies that are made by dividing the wafer composite 25 of FIG. 7a into smaller lens body units or into individual lens bodies 3 with semiconductor chips 2, to thereby create a plurality of individual light-emitting diodes.

The additional advantageous technical elements described in concrete terms in individual exemplary embodiments can, of course, be implemented to the extent possible in the case of all other exemplary embodiments. Thus, for example, in the case of the exemplary embodiment in accordance with FIG. 1 it is also possible to use a reflecting layer 16 in accordance with the exemplary embodiment of FIGS. 2 and 3.

The description of the invention with the aid of the exemplary embodiments is, of course, also not to be understood as limiting the invention to these exemplary embodiments. Rather, the scope of the invention includes any design of a light-emitting diode in the case of which use is made of a lens body that is fabricated, in particular, from inorganic material and which is used, in particular, specifically for heat dissipation from the semiconductor body.

In a preferred method for fabricating a light-emitting diode according to the invention, the semiconductor chip 2 is connected to the electric conductor track 12 through the lens body 3 by means of laser soldering. In this process, the first step is preferably to fabricate a plurality of lens bodies 3 in the wafer composite. Before the division of this wafer composite into individual smaller lens body units or individual lens bodies 3, on the side of the wafer composite averted from the radiating side of the lens bodies 3 the semiconductor chips 2 are fastened on the wafer composite by means of laser soldering by using a laser to solder the contact layers 8 through the wafer composite to the conductor tracks 12, for example metalization layers. Before the division of the wafer composite, electric conductor tracks 22 are preferably also further applied to the lens body/wafer composite for the purpose of connecting the rear contacts 7 of the semiconductor chips 2.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A light-emitting diode comprising a semiconductor chip (2) that has a photon-emitting active layer (5) applied on a substrate (4), and, seen from the substrate (4), a contact layer (8) subsequent to the active layer (5), wherein there is arranged on the contact layer (8) a lens body (3) that is made from a radiation-resistant solid, is transparent to the emitted photons, and dissipates the heat from the active layer (5); and
wherein a heat sink (13, 24) is fitted on the lens body (3).

2. The light-emitting diode as claimed in claim 1, wherein the lens body (3) is provided with a conductor track (12) that makes contact with contact layer (8).

3. The light-emitting diode as claimed in claim 1, wherein the lens body (3) has the shape of a spherical segment.

4. The light-emitting diode as claimed in claim 1, wherein the lens body (3) has an antireflection layer (15) on a luminous surface (11).

5. The light-emitting diode as claimed in claim 1, wherein a layer (15) on a luminous surface (11) of the lens body (3) contains optical conversion materials.

6. The light-emitting diode as claimed in claim 1, wherein the semiconductor chip (2) is mounted in a depression (14) in the lens body (3).

7. The light-emitting diode as claimed in claim 6, wherein regions (6) of the active layer (5) that emit in a lateral direction are situated inside the depression (14) in such a way that photons (17b) emerging from the laterally emitting regions (6) of the active layer (5) are coupled into the lens body (3).

8. The light-emitting diode as claimed in claim 1, wherein a rear side, facing the semiconductor chip (2), of the lens body (3) is at least partially reflective coated.

9. The light-emitting diode as claimed in claim 1, wherein the lens body (3) is fabricated from SiC, $Al_2O_3$ or a garnet crystal.

10. The light-emitting diode as claimed in claim 1, wherein the active layer (5) is fabricated on the basis of $Ga_xAl_yIn_{1-x-y}N$ in which case it holds that $0 \leq x \leq 1$, $0 \leq y \leq 1$ and $x+y \leq 1$.

11. The light-emitting diode as claimed in claim 10, wherein the substrate is an electrically conducting substrate which acts as one of the electric connections of the active layer (5).

12. The light-emitting diode as claimed in claim 11, wherein the substrate is a doped SiC substrate.

13. The light-emitting diode as claimed in claim 1, wherein a plurality of semiconductor chips (2) are mounted next to one another on the lens body (3).

14. The light-emitting diode as claimed in claim 13, wherein all the semiconductor chips (2a, 2b) are arranged in depressions (14).

15. The light-emitting diode as claimed in claim 1, wherein the light-emitting diode is provided with a housing (20) that is equipped with a thread (21) for screwing into a lamp holder.

16. The light-emitting diode as claimed in claim 1, wherein the light-emitting diode is provided on the rear side of the lens body (3) with a surface-mountable housing that can be mounted on the surface of an electric connecting plate.

17. The light-emitting diode as claimed in claim 1, wherein the semiconductor chip (2) emits, inter alia, radiation from the ultraviolet spectral region.

18. The light-emitting diode as claimed in claim 1, wherein the semiconductor chip (2) has a reflecting layer (7) on the side averted from the lens body (3).

19. The light-emitting diode as claimed in claim 1, wherein the semiconductor chip (2) emits, inter alia, radiation from the blue or short wave green spectral region.

20. The light-emitting diode as claimed in claim 1, wherein the spacing of the active layer (5) from the lens body (3) is small by comparison with the thickness of the substrate (4).

21. A method for producing a light-emitting diode as claimed in claim 1, in which the semiconductor chip (2) is connected to the lens body (3) by means of laser soldering through the lens body (3), in particular via a conductor track (12) located on the lens body (3).

22. The method as claimed in claim 21, having the following method steps:
(a) fabricating a plurality of lens bodies (3) in a wafer composite;
(b) applying conductor tracks (12) for a plurality of semiconductor chips (2) to the side of the wafer composite on which the semiconductor chips are later mounted;
(c) fastening a plurality of semiconductor chips on the conductor tracks (12) by means of laser soldering through the wafer composite; and
(d) dividing the wafer composite into smaller lens body units or into individual lens bodies (3) with semiconductor chips (2).

23. The method as claimed in claim 22, in which between the steps (c) and (d) electric conductor tracks (22) for the electric connection of rear contacts (7) of the semiconductor chips (2) are applied to the wafer composite.

* * * * *